United States Patent
Kitagawa et al.

(10) Patent No.: US 7,910,493 B2
(45) Date of Patent: Mar. 22, 2011

(54) SEMICONDUCTOR DEVICE MANUFACTURING METHOD, SEMICONDUCTOR DEVICE, PLASMA NITRIDING TREATMENT METHOD, CONTROL PROGRAM AND COMPUTER STORAGE MEDIUM

(75) Inventors: Junichi Kitagawa, Amagasaki (JP); Takashi Kobayashi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 584 days.

(21) Appl. No.: 11/911,621

(22) PCT Filed: Apr. 14, 2006

(86) PCT No.: PCT/JP2006/307923
§ 371 (c)(1),
(2), (4) Date: Oct. 15, 2007

(87) PCT Pub. No.: WO2006/112388
PCT Pub. Date: Oct. 26, 2006

(65) Prior Publication Data
US 2009/0039406 A1    Feb. 12, 2009

(30) Foreign Application Priority Data
Apr. 15, 2005    (JP) .................................. 2005-119029

(51) Int. Cl.
*H01L 21/32*    (2006.01)
*H01L 21/469*    (2006.01)

(52) U.S. Cl. ........ 438/769; 438/763; 438/776; 257/E29; 257/126

(58) Field of Classification Search .................. 438/763, 438/769, 776
See application file for complete search history.

(56) References Cited

U.S. PATENT DOCUMENTS

| | | | |
|---|---|---|---|
| 6,069,041 A | 5/2000 | Tanigami et al. | |
| 2004/0119111 A1 | 6/2004 | Omi et al. | |
| 2004/0142577 A1 | 7/2004 | Sugawara et al. | |
| 2005/0233599 A1 | 10/2005 | Sugawara et al. | |

FOREIGN PATENT DOCUMENTS

| | | |
|---|---|---|
| JP | 10-335500 | 12/1998 |
| JP | 2004 193413 | 7/2004 |
| JP | 2006 5323 | 1/2006 |
| WO | WO 02/058130 A1 | 7/2002 |
| WO | 2004 084314 | 9/2004 |

*Primary Examiner* — Alexander G Ghyka
(74) *Attorney, Agent, or Firm* — Oblon, Spivak, McClelland, Maier & Neustadt, L.L.P.

(57) ABSTRACT

A nitrided region is formed on a surface of a polysilicon layer by a nitriding treatment wherein plasma of a processing gas is generated by introducing microwaves into a processing chamber by a planar antenna having a plurality of slots. Then, a CVD oxide film or the like is formed on the nitrided region and after patterning the polysilicon layer and the like after the prescribed shape, and then, a thermal oxide film is formed by thermal oxidation on exposed side walls and the like of the polysilicon layer by having the nitrided region as an oxidation barrier layer. Thus, generation of bird's beak can be suppressed in the process at a temperature lower than the temperature in a conventional process.

19 Claims, 7 Drawing Sheets

SEMICONDUCTOR DEVICE MANUFACTURING METHOD, SEMICONDUCTOR DEVICE, PLASMA NITRIDING TREATMENT METHOD, CONTROL PROGRAM AND COMPUTER STORAGE MEDIUM

FIELD OF THE INVENTION

The present invention relates to a method for manufacturing a semiconductor device having a process for forming a thermal oxide film on a silicon layer, a semiconductor device, a method for a plasma nitriding treatment, a control program and a computer storage medium.

BACKGROUND OF THE INVENTION

Conventionally, in a process of manufacturing a semiconductor device and the like, an insulating layer (e.g., a CVD oxide film and the like) and the like are successively laminated on a silicon layer, e.g., a polysilicon layer forming an electrode, and then, the polysilicon layer and the CVD oxide film and the like formed thereon are patterned after a specific shape by an etching process and the like by using a photolithographic process. Thereafter, an oxide film is formed on exposed sidewalls and the like of the polysilicon layer by a thermal oxidation.

However, there has been a problem of the so-call "bird's beak formation", in the process of manufacturing a semiconductor device in which the thermal oxidation continues to proceed into both end portions of the polysilicon layer at an interface portion between the polysilicon layer and the CVD oxide film or the like.

Since the bird's beak locally forms a thick oxide film without being controlled and the amount of oxidation varies, there generate adverse effects of a deterioration, a variation and the like on a performance of the semiconductor device.

Further, there has been proposed a technique to solve the problem, wherein a polysilicon layer, a CVD oxide film or the like are successively formed, and then, a nitride layer is formed on a surface portion of the oxide film and at an interface portion between the polysilicon layer and the CVD oxide film by a heat treatment in ammonia gas atmosphere. (see, Patent Reference 1)

However, the heat treatment is performed at a high temperature of, e.g., 700° C., and thus, an end portion of the interface between the polysilicon layer and the oxide film is oxidized to thereby become thick. Thus, since the entire manufacturing process of the next generation semiconductor device can be affected by the heat generated, it is hard to control a uniformly ultra-thin nitride layer in a fine accuracy. Therefore, this method cannot be favorably employed to improve and stabilize the performance of the semiconductor device.

As described above, conventionally, there has been the problem, the bird's beak, occurring at the interface portion between the polysilicon layer and the CVD oxide film or the like, and it is required to employ a high temperature heat treatment at to solve the problem. Consequently, there has been an increasing demand for developing a semiconductor device and a method for the manufacture thereof capable of providing uniformly ultra-thin nitrided region by suppressing the bird's beak through the use of a process performed at a lower temperature. Patent Reference 1: Japanese Patent Laid-open Application No. H10-335500

SUMMARY OF THE INVENTION

The present invention has been made to solve the prior art problem described above and provides a method for manufacturing a semiconductor device, a semiconductor device, a method for a plasma nitriding treatment, a control program and a computer storage medium, which are capable of suppressing the generation of bird's beak through the use of a process performed at a lower temperature by a plasma processing, in contrast with the conventional technique.

In accordance with a first aspect of the present invention, there is provided a method for manufacturing a semiconductor device including: a nitrided region forming process for forming a nitrided region on a layer having silicon on a target substrate to be processed by using a plasma which is generated by introducing a microwave into a processing chamber by means of a planar antenna provided with a plurality of slots; and a thermal oxide film forming process for forming an oxide film on the layer having silicon on the target substrate to be processed by a heat treatment while the nitrided region functions as an oxidation barrier.

Preferably, the nitrided region is formed on a surface portion of the layer including silicon; and the oxide film may be formed on sidewalls exposed by an etching process of the layer including silicon.

Preferably, the nitrided region forming process is performed for 10 sec or longer.

More preferably, the nitrided region forming process is performed for 30 sec or longer.

The layer including silicon may be made of a silicon oxide and the nitrided region forming process may be performed for 60 sec or longer.

Preferably, the nitrided region forming process is performed for 90 sec or longer.

Preferably, the nitrided region forming process is performed at a temperature in a range of, e.g., from 100° C. to 600° C.

Preferably, the nitrided region forming process contains nitrogen gas and a rare gas.

Preferably, the rare gas is Argon gas, Xenon gas or Krypton gas.

In accordance with a second aspect of the present invention, there is provided a semiconductor device manufactured by using the above method.

In accordance with a third aspect of present invention, there is provided a method for a plasma nitriding treatment, wherein a nitrided region is formed, which functions as an oxidation barrier in a post processing, on a layer including silicon in a target substrate to be processed by the plasma generated by introducing a microwave into a processing chamber by means of a planar antenna provided with a plurality of slots.

Preferably, the layer including silicon is made of a polysilicon and the process for forming the nitrided region may be performed for 10 sec or longer.

More preferably, the nitrided region is performed for 30 sec or longer.

The layer including silicon may be made of a silicon oxide and the process for forming the nitrided region may be performed for 60 sec or longer.

Further, the process for forming the nitrided region may be performed for 90 sec or longer.

Preferably, the process for forming the nitrided region is performed at a temperature in a range of, e.g., from 100° C. to 600° C.

Preferably, a processing gas for forming the nitrided region contains nitrogen gas and a rare gas.

Preferably, the rare gas is Argon gas, Xenon gas or Krypton gas.

In accordance with a fourth aspect of the present invention, there is provided a computer-executable control program that controls, when executed, a plasma processing apparatus to execute the method for a plasma nitriding treatment.

In accordance with a fifth aspect of the present invention, there is provided a computer storage medium for storing therein a computer-executable control program, wherein the control program controls, when executed, a plasma processing apparatus to execute the method for a plasma nitriding treatment.

DETAILED DESCRIPTION OF THE EMBODIMENTS

Hereinafter, embodiments of the present invention will be described in detail with reference to the accompanying drawings.

Figure 1A:
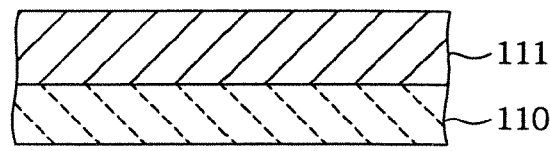
FIG. 1 provides enlarged diagrams of principal configurations of semiconductor wafers in accordance with a first embodiment of the present invention.

FIGS. 1A to 1D provide enlarged cross sectional configurations of a wafer W which is a substrate to be processed used for manufacturing a semiconductor device in accordance with an embodiment of the present invention. In FIG. 1A, reference numeral ill is a silicon layer formed of polysilicon which makes up, e.g., an electrode. Reference numeral 110 is a base layer formed of an insulating film, e.g., a gate oxide film, a tunnel oxide film or the like.

Figure 1B:
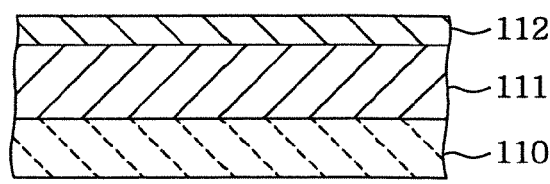

In accordance with the embodiment of the present invention, a highly ultra-thin nitrided region 112 is formed on a surface portion of the polysilicon layer 111, as shown in FIG. 1B. The nitrided region 112 is formed uniformly by nitriding the surface portion of the polysilicon layer 111 by using a plasma generated by radiating a processing gas in a chamber with a microwave introduced into the chamber by using a planar antenna provided with a multiplicity of slots. The nitriding treatment will be described later in detail.

Figure 1C:
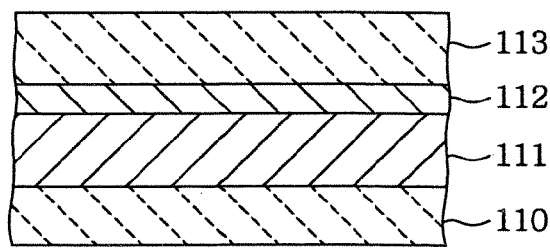

Then, e.g., a CVD oxide film ($SiO_2$) 113 and the like are formed on the nitrided region 112 as presented in FIG. 1C. Thereafter, if necessary, a nitride film (SiN), a CVD oxide film, a polysilicon film, an insulating film and the like are appropriately laminated on the CVD oxide film 113. For example, in case of forming a non-volatile memory device, an insulating film having an ONO structure and a polysilicon layer which becomes a control gate and the like are successively formed on the CVD oxide film 113. A dopant such as P, B, As and the like is doped on the polysilicon layer.

Figure 1D:
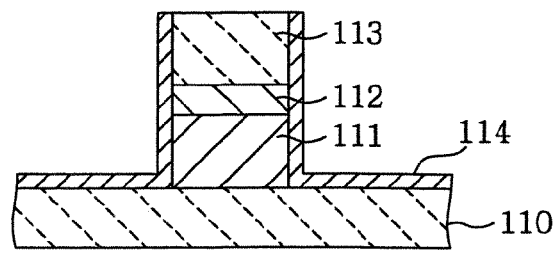

After laminating the layers for forming a necessary device structure, the polysilicon layer 111, the nitrided region 112 and the CVD oxide film 113 (and each layer formed on CVD oxide film 113) are patterned after a specific pattern by an etching process by using a photorisography, as shown in FIG. 1D. Thereafter, a thermal oxide film 114 is formed by a thermal oxidation at a temperature of, e.g., about 900° C. on exposed sidewalls and the like of the polysilicon layer 111. At this time, the nitrided region 112 has been uniformly formed between the polysilicon layer 111 and the CVD oxide film 113. Since the nitrided region 112 functions as an oxidation barrier layer, bird's beak can be restrained from being formed by suppressing the effects of the thermal oxidation to an end portion of the polysilicon layer.

Figure 3:
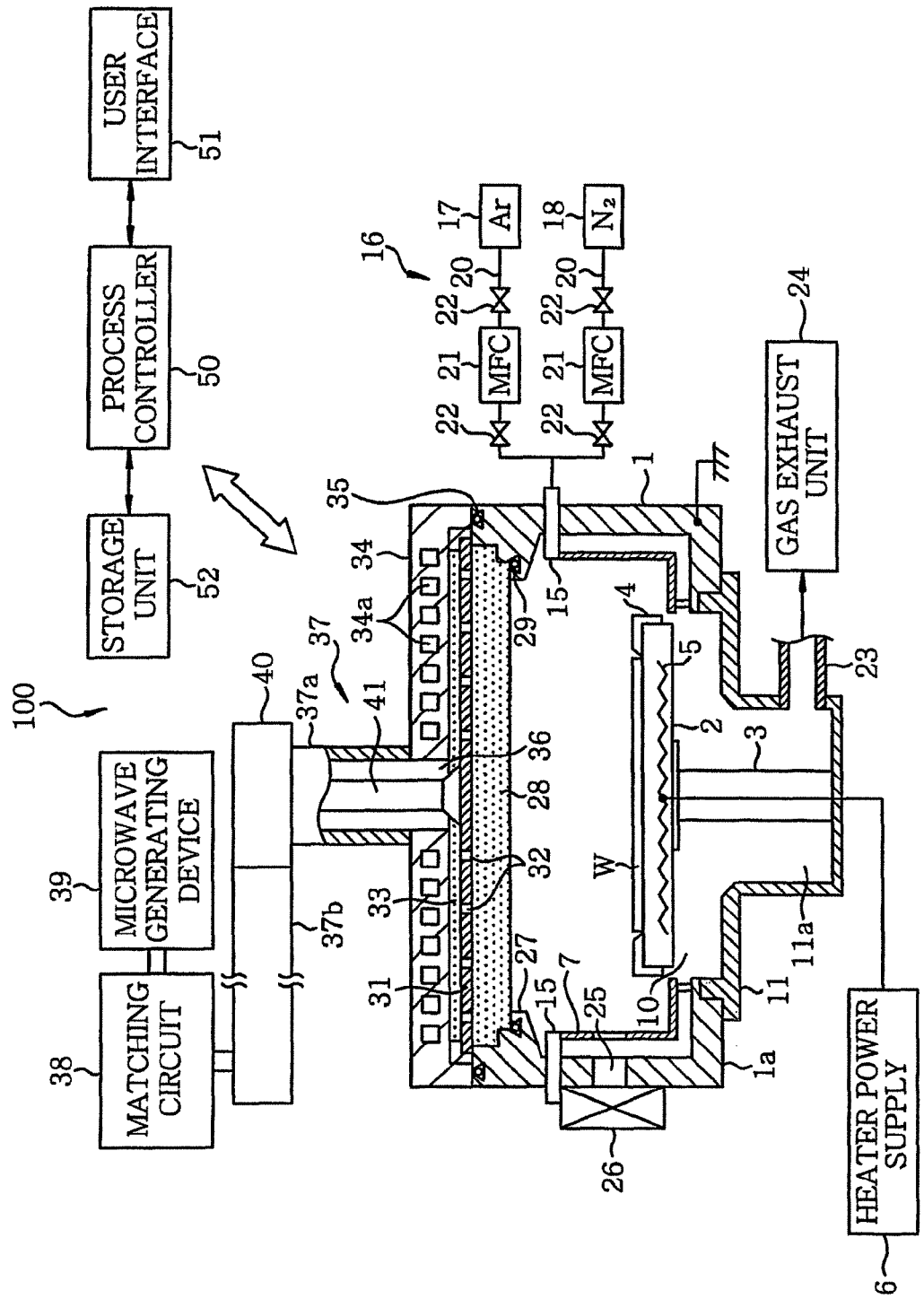
FIG. 3 depicts a schematic view showing a plasma processing apparatus used in an embodiment of the present invention.

Hereinafter, a configuration of a plasma processing apparatus 100 used in a process for forming a nitrided region 112 in accordance with the embodiment of the present invention will be explained with reference to FIG. 3. The plasma processing apparatus 100 is configured as an RLSA microwave plasma processing apparatus which generates plasma by radiating a microwave, which is induced from a microwave generator, into a chamber by using a planar antenna (Radial Line Slot Antenna) provided with a multiplicity of slots arranged in a specific pattern.

The plasma processing apparatus 100 includes a substantially cylindrical chamber 1 which is airtightly sealed and grounded. A circular opening 10 is provided at a substantially central portion of a bottom wall 1a of the chamber 1, and a gas exhaust chamber 11 communicating with the opening 10 is provided at the bottom wall 1a in a manner that it protrudes downward. A susceptor 2 made of ceramic, e.g., AlN, is disposed in the chamber 1 to horizontally support thereon a wafer W, which is a substrate to be processed. The susceptor 2 is supported by a cylindrical supporting member 3 made of ceramic, e.g., AlN, and extending upward from a central bottom portion of the gas exhaust chamber 11. A guide ring 4 for guiding the wafer W is disposed on the outer periphery portion of the susceptor 2.

Further, a resistance heater 5 is buried in the susceptor 2 to heat the susceptor 2 by a power supplied from a heater power supply 6, and the wafer W to be processed is heated by the heated susceptor 2. Here, the temperature of the wafer W can be controlled within a range from, e.g., a room temperature to about 800° C. Further, a cylindrical liner 7 made of a dielectric material, e.g., quartz, is provided on an inner periphery of the chamber 1. Further, a baffle plate 12 provided with a multiplicity of openings for an exhaust encloses a periphery of the lower susceptor 2.

The susceptor 2 is provided with wafer supporting pins (not shown) which serve to support the wafer W, while moving up and down the wafer W, wherein the wafer supporting pins are configured to be protrusible above and retractable below the surface of the susceptor 2.

A ring shaped gas introducing member 15 is provided on a sidewall of the chamber 1, and a gas supply system 16 is connected to the gas introducing member 15. The gas introducing member 15 may be disposed in a shower shape. The gas supply system 16 includes Ar gas supply source 17 and $N_2$ gas supply source 18, and these gases are supplied to the gas introducing member 15 through respective gas lines 20 to be introduced into the chamber 1 through the gas introducing member 15. Each of the gas lines 20 is provided with a mass flow controller 21 and opening/closing valves 22 disposed at an upstream and a downstream side of the mass flow controller 21.

A gas exhaust line 23 is connected to a side surface of the exhaust chamber 11, and a gas exhaust unit 24 having a high speed vacuum pump is connected to the gas exhaust line 23. By operating the gas exhaust unit 24, a gas in the chamber 1 is uniformly discharged into a space 11a of the exhaust chamber 11 to be exhausted outside through the gas exhaust line 23. Accordingly, the inside of the chamber 1 can be depressurized to a vacuum level, e.g., about 0.133 Pa, at a high speed.

At the sidewall of the chamber 1, there are provided a loading/unloading port 25 through which the wafer W is transferred between the chamber 1 and a transfer chamber (not shown) disposed adjacent to the plasma processing apparatus 100; and a gate valve 26 for opening and closing the loading/unloading port 25.

The chamber 1 has an opening at its top, and an annular support 27 is provided along the circumference of the opening. A microwave transmitting plate 28 made of a dielectric material, e.g., quartz or ceramic such as $Al_2O_3$ or the like, is airtightly disposed on the support 27 via a seal member 29. Accordingly, the inside of the chamber 1 is hermetically kept.

Figure 4:
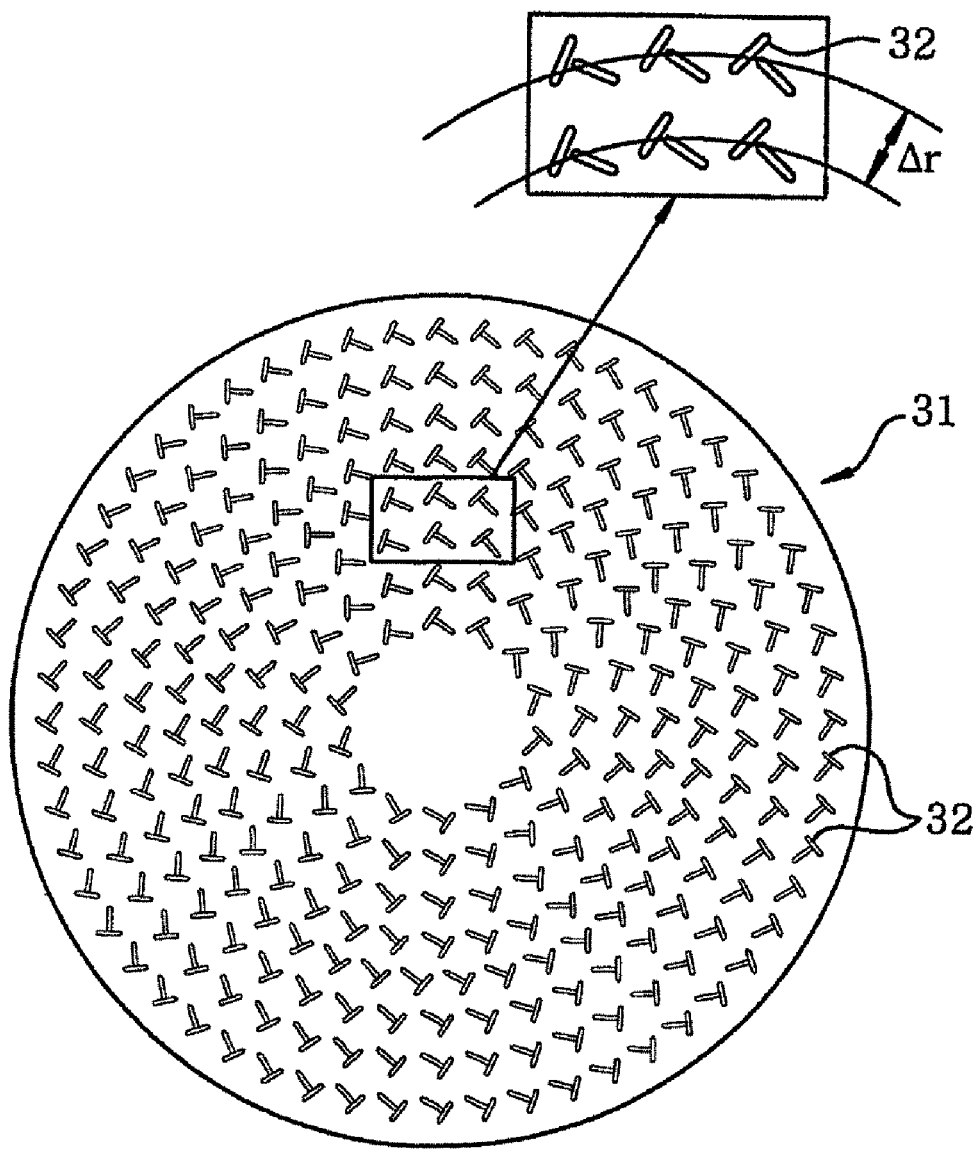
FIG. 4 is a diagram showing a configuration of a principal part in the plasma processing apparatus shown in FIG. 3.

A circular plate shaped planar antenna member 31 is provided on the microwave transmitting plate 28 to be opposite to the susceptor 2. The planar antenna member 31 is held by a top end of the support 27. The planar antenna member 31 is made of a conductor, e.g., aluminum plate or copper plate plated with gold or silver, and it is provided with a plurality of microwave radiation holes (slots) 32 formed therethrough in a certain pattern. Each microwave radiation hole 32 is formed in, e.g., an elongated groove shape as shown in FIG. 4, and the adjacent microwave radiation holes 32 are arranged to cross each other, typically in a perpendicular manner (in a T-shape), as shown in FIG. 4. These microwave radiation holes 32 are concentrically disposed. That is, the planar antenna member 31 is configured as an RLSA antenna.

The length of each microwave radiation hole 32 and an arrangement interval between the microwave radiation holes 32 are determined depending on a wavelength g of the microwave. For example, the microwave radiation holes 32 are disposed at an interval of $\lambda/4$, $\lambda/2$ or $\lambda$. Further, the microwave radiation holes 32 may be formed in different shapes such as a circular shape, an arc shape and the like. Further, the arrangement pattern of the microwave radiation holes 32 is not limited to the concentric circular pattern exemplified herein but they may be disposed in, e.g., a spiral shape, a radial shape or the like. On a top surface of the planar antenna member 31, there is disposed a wave delay plate 33 formed of a dielectric material, e.g., quartz, having a dielectric constant greater than that of a vacuum.

On a top surface of the chamber 1, a shield cover 34 made of a metal material, e.g., aluminum, stainless steel or the like, is provided to cover the planar antenna member 31 and the wave delay plate 33. A seal member 35 seals between the top surface of the chamber 1 and the shield cover 34. Further, a cooling water path 34a is formed in the shield cover 34, and the shield cover 34 is grounded.

The shield cover 34 has an opening 36 in a center of its top wall, and a waveguide 37 is connected to the opening 36. A microwave generating device 39 is connected to an end portion of the waveguide 37 via a matching circuit 38, whereby a microwave having a frequency of, e.g., about 2.45 GHz generated from the microwave generating device 39 is allowed to propagate to the planar antenna member 31 through the waveguide 37. Here, a microwave having a frequency of about 8.35 GHz, about 1.98 GHz may be used.

The waveguide 37 includes a coaxial waveguide 37a having a circular shape cross section and extending upward from the opening 36 of the shield cover 34; and a rectangular waveguide 37b having a rectangular shape cross section and extending in a horizontal direction. A mode transducer 40 is disposed between them. Further, an internal conductor 41 extends in the coaxial waveguide 37a, and a lower end of the internal conductor 41 is fixedly connected to the center of the planar antenna member 31.

Each component of the plasma processing apparatus 100 is connected to and controlled by a process controller 50. A user interface 51 is connected to the process controller 50, wherein the user interface 51 includes, e.g., a keyboard for a process manager to input a command to operate the plasma processing apparatus 100, a display for showing an operational status of the plasma processing apparatus 100 and the like.

Moreover, connected to the process controller 50 is a storage unit 52 for storing therein control programs for implementing various processes, which are performed in the plasma processing apparatus 100 under the control of the process controller 50, and programs or recipes to be used in carrying out the various processes by each component of the plasma etching apparatus according to processing conditions. The recipes can be stored in a hard disk or a semiconductor memory, or can be set at a certain position of the storage unit 52 while being recorded on a portable storage medium such as a CDROM, a DVD and the like. Alternatively, the recipes can be transmitted from another apparatus via, e.g., a dedicated line.

When a command is received from the user interface 51, the process controller 50 retrieves a necessary recipe from the storage unit 52 and performs a desired process in the plasma processing apparatus 100 under the control of the process controller 50.

Figure 5:
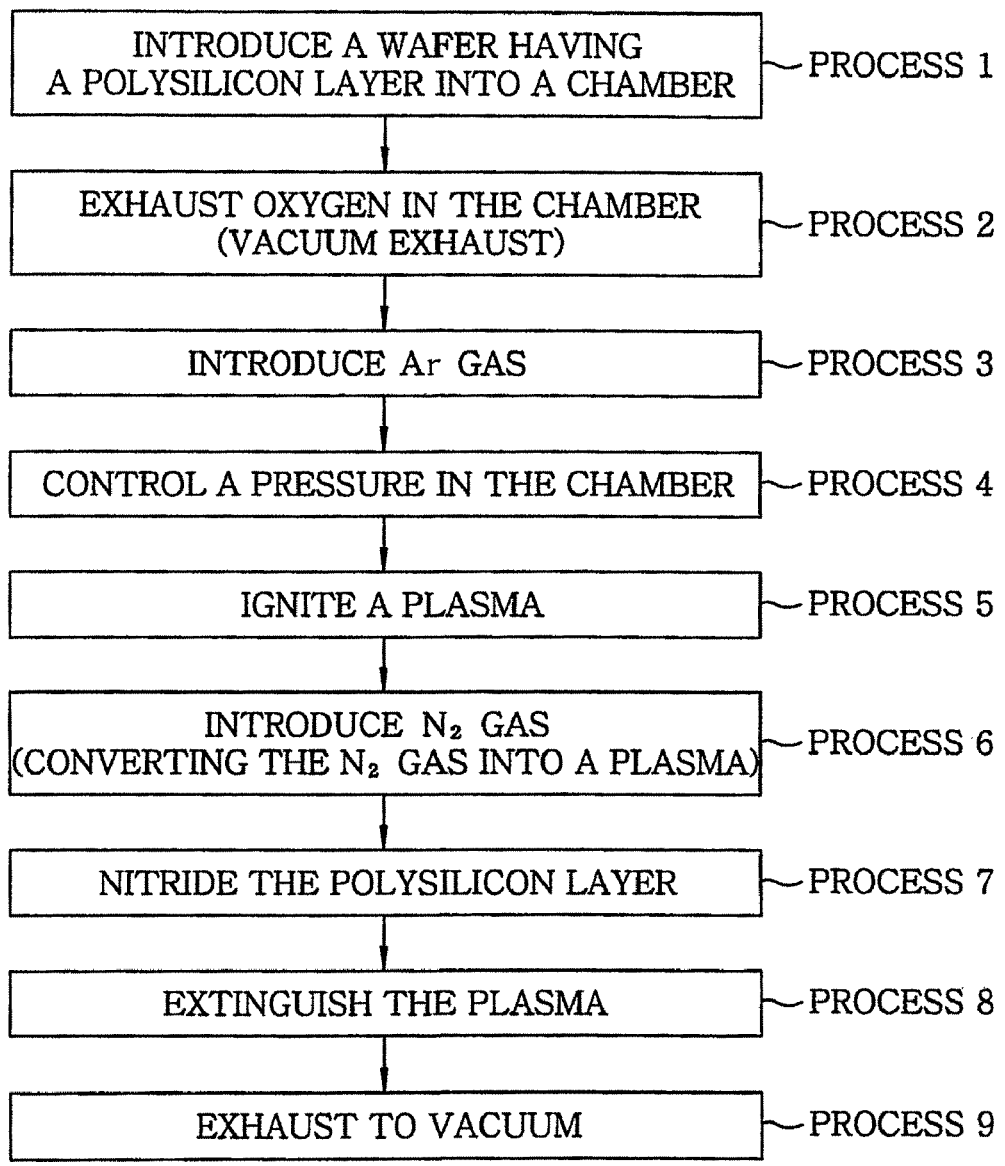
FIG. 5 offers a flow diagram presenting a process of a nitriding treatment performed in the plasma processing apparatus shown in FIG. 3.

Hereinafter, a plasma nitriding treatment performed by the plasma processing apparatus 100 having the configuration as described above will be explained with reference to a flowchart of FIG. 5.

First, the gate valve 26 is opened, and a wafer W having the polysilicon layer 111 in a state of FIG. 1A is loaded into the chamber 1 through the loading/unloading port 25, mounted on the susceptor 2 and heated (step 1).

Subsequently, to remove oxygen from the inside of the chamber 1, the chamber 1 is vacuum exhausted (step 2). In this case, the vacuum exhaust may be performed by supplying an inert gas Ar, $N_2$ or the like that does not include oxygen. Ar gas is supplied into the chamber 1 from the Ar gas supply source 17 via the gas introducing member 15 (step 3). By controlling the internal pressure of the chamber 1 by means of adjusting the flow rate of the Ar gas, the chamber 1 is kept in a high pressure state in which plasma ignition readily occurs (step 4). Here, the pressure level is preferably set to be in a range from about 13.3 to 267 Pa and, for example, is set to about 66.6 Pa or 126 Pa. Further, the internal pressure in this process is set to be higher than that in the nitriding treatment to be described later.

Thereafter, a plasma ignition is carried out by radiating a microwave into the chamber 1 (step 5). At this time, the microwave from the microwave generating device 39 is first directed to the waveguide 37 via the matching circuit 38. The microwave propagates through the rectangular waveguide 37b, the mode transducer 40 and the coaxial waveguide 37a sequentially, and then, the microwave is uniformly supplied to the planar antenna member 31 in a radial shape. Then, the microwave is radiated into a space above the wafer W in the chamber 1 from the slots 32 of the planar antenna member 31 via the microwave transmitting plate 28. In the chamber 1, the Ar gas is converted into plasma by the microwave thus radiated into the chamber 1. At this time, the power level of the microwave is preferably set to be in a range from about 1000 to 3000 W and is set to about 1600 W for example. After the plasma ignition, the internal pressure of the chamber 1 is regulated at, e.g., about 12.0 Pa.

After the plasma ignition, $N_2$ gas is introduced at a specific flow rate into the chamber 1 from the $N_2$ gas supply source 18 of the gas supply system 16 via the gas introducing member 15. The $N_2$ gas is also converted into plasma by the microwave radiated into the chamber 1 (step 6).

By the plasma of the Ar gas and the $N_2$ gas so generated, a nitriding treatment is performed on the polysilicon layer formed on the wafer W (step 7). At this time, a pressure level is preferably set to be in a range from about 1.33 to 399 Pa, and, for example, 12 Pa of the pressure level is employed. Further, a processing temperature is preferably set to be in a range from about 100 to 600° C., more preferably, from about 300 to 500° C. and, for example, 400° C. of the processing temperature is employed. Further, the flow rate of the Ar gas preferably ranges from about 200 to 3000 sccm, and the flow rate of the $N_2$ gas preferably ranges from about 1 to 200 sccm. For example, the flow rates of the Ar and the $N_2$ gas can be set to be 1000 sccm and 40 sccm, respectively.

Further, a flow rate ratio between the Ar gas and the $N_2$ gas (Ar/$N_2$) is preferably set to be in a range from about 1.0 to 300 and, more preferably, is set to be in a range from about 10 to 100. Moreover, a processing time is preferably set to be 10 sec or greater, more preferably is set to be 30 sec or greater and 60 sec of a processing time is exemplified. Nitriding the surface of the polysilicon may be fine with a nitrided thickness of 0.1 nm dimension (numbers of angstrom), preferably, is fine with a thickness of 1 nm or greater.

After performing the nitriding treatment for the specific time period as described above, the radiation of the microwave is stopped and the plasma is OFF (step 8), and the supply of the gases is stopped while the vacuum exhaust of the chamber is being performed (step 9). So, the sequence of the nitriding treatment is finished.

In the above process, though the Ar gas is first supplied and the $N_2$ gas is supplied after igniting the plasma, it is also possible to supply the Ar gas and the $N_2$ gas simultaneously, as long as the plasma can be ignited thereafter.

The microwave plasma described above is a low electron temperature plasma of about 0.5 to 1.5 eV having a plasma density in a range from about $1 \times 10^{10}$ to $5 \times 10^{12}/cm^3$ or higher. With this microwave plasma, it is possible, through the low-temperature (for example, 400° C.) and the short-period processing as described above, to form a nitrided region of a high nitrogen concentration at a surface portion of the polysilicon layer, specifically, at an outermost surface portion of the polysilicon layer ranging from its top surface down to a depth of 5 nm, preferably 3 nm therefrom.

Further, using the microwave plasma also has a merit in that a plasma damage due to, e.g., an ion impact on an underlying film can be reduced. Furthermore, since the nitriding treatment is performed at a low temperature by the high-density plasma for the short period of time, a nitrogen profile of the nitrided region can be controlled to be of a high density so that a fine barrier layer against an oxidation can be formed.

Figure 2:
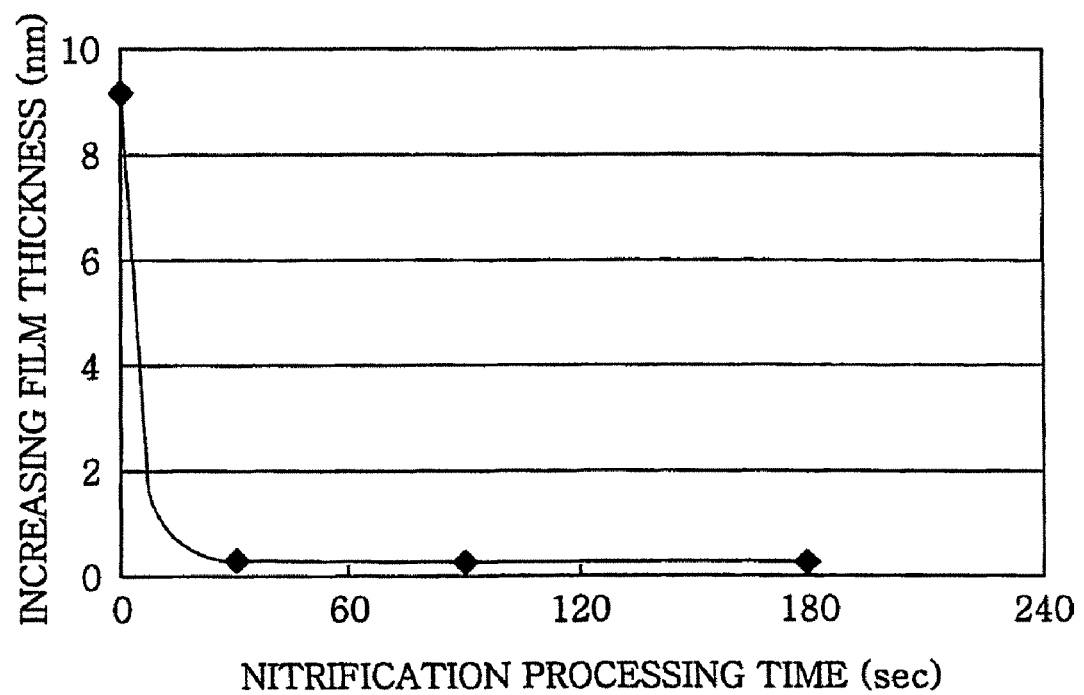
FIG. 2 presents a graph showing a result of measurements on an effect of an oxidation barrier layer by a nitriding treatment.

FIG. 2 is a graph showing a result obtained by carrying out an actual thermal oxidation and examining a re-oxidation state in order to measure the effects of the nitrided region as an oxidation barrier layer which is formed in the nitrided region forming process (processing temperature: 400° C.). A vertical axis and a horizontal axis of the graph represent an increasing film thickness and a nitriding time respectively. The increasing film thickness is given by a difference between a nitrided film thickness and the film thickness after the oxidation processing. The increasing film thickness was measured with an optical film thickness meter (ellipsometer).

An oxidation film of a thickness of 9 nm was formed by carrying out the oxidation process under conditions (temperature: 850° C., processing time: 10 minutes, processing atmosphere: $O_2$ gas) for forming the thermal oxidation film on a silicon substrate without a nitrided region, as shown in FIG. 2. Thereafter, nitride regions were formed on a surface of the silicon substrate by employing nitriding for 30 sec, 90 sec and 180 sec respectively by the plasma processing. Subsequently, when thermal processing was performed on the silicon substrate under the above conditions (temperature: 850° C., processing time: 10 minutes, processing atmosphere: $O_2$ gas), it was found that oxidation films were hardly formed at an interface between the silicon and the nitride film, resulting in respective film thicknesses only about 0.3, 0.23 and 0.21 nm. The thickness of increasing film at the interface was fine under the level of 0.1 nm dimension (numbers of angstrom). As described above, it is confirmed that a nitrided region having sufficient effects as the oxidation barrier layer can be formed by the plasma nitriding treatment in accordance with the embodiment of the present invention.

As described above, in the embodiment of the present invention, a nitrided region having sufficient effects as the oxidation barrier layer can be formed by performing the plasma nitriding treatment at a low temperature, thereby suppressing a diffusion of oxygen to form an oxide film and a generation of the bird's beak at the end portion of the silicon layer in the thermal oxidation process of a post processing. Therefore, it is possible to stably manufacture further enhanced high-performance semiconductor devices in comparison with the past.

Figure 6:
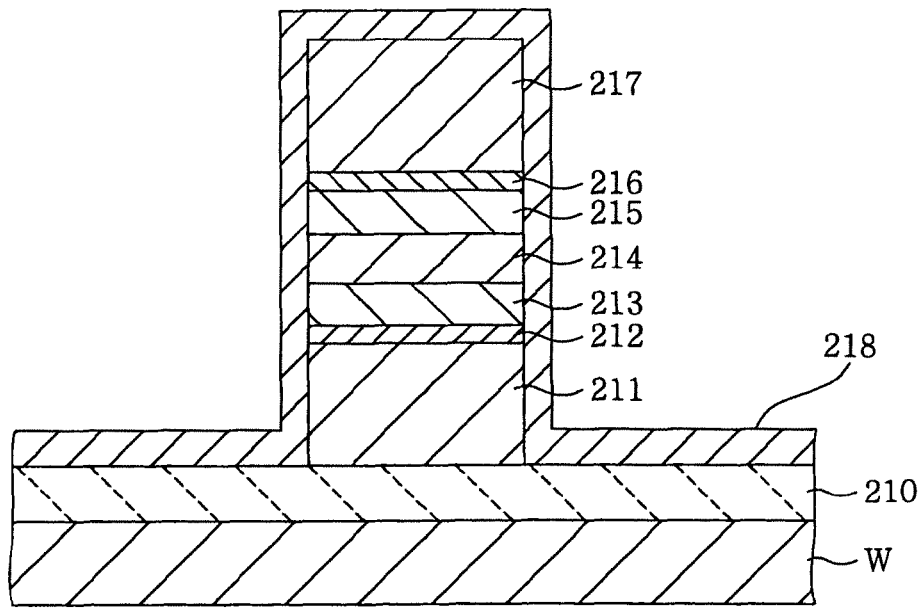
FIG. 6 provides an enlarged diagram presenting a principal configuration of a semiconductor wafer in accordance with another embodiment of the present invention.

FIG. 6 is an enlarged diagram showing a cross sectional configuration of a wafer in a case of forming a non-volatile memory in accordance with another embodiment of the present invention. As shown in FIG. 6, the structure of the wafer is as follows: a tunnel oxide film 210 and a polysilicon layer 211 are formed successively on a surface of a wafer W; a highly ultra-thin nitrided region 212 is formed on a surface of the polysilicon layer 211 by the plasma nitriding treatment as described in the above embodiment; an insulating film of an ONO structure made up of, e.g., an oxide film ($SiO_2$) 213, a nitride film (SiN) 214 and an oxide film ($SiO_2$) 215 is formed on the nitrided region 212; a highly ultra-thin nitrided region 216 is formed on a surface of the oxide film 215 by the plasma nitriding treatment as described in the above embodiment; and a polysilicon layer 217 which becomes a control gate is formed on the nitrided region 216.

Further, a thermal oxide film 218 is formed on the sidewalls of the layers formed on the wafer W and a surface of the polysilicon layer 217 by a thermal oxidation at a temperature of, e.g., about 900° C. The nitrided region 212 is formed uniformly between the polysilicon layer 211 and the oxide film 213 and at the same time, a nitrided region 216 is formed between the oxide film 215 and the polysilicon layer 217. Since these nitrided regions 212, 216 function as oxidation barriers, the thermal oxidation effect on end portions of the polysilicon layers 211, 217 is restrained, thereby suppressing the bird's beak. In this case, an oxide film may be formed on the sidewalls and the surface of the polysilicon layer with a plasma of $O_2$ gas, as a substitute for $N_2$ gas, by employing the plasma apparatus in accordance with the embodiment of the present invention instead of the thermal oxidation method. Accordingly, it is possible to form the oxide film at a low temperature, thereby controlling the film thickness.

In the embodiment of the above configuration, forming the nitrided region 212 on the polysilicon layer 211 can be executed in the same manner as the above embodiment of the present invention. Further, the plasma apparatus 100 shown in FIGS. 3, 4 can be used for forming the nitrided region 216 on the oxide film 215 similarly to the embodiment described above. That is, the nitrided region can be uniformly formed by steps of: introducing a microwave into a processing chamber by means of a planar antenna provided with a plurality of slots; generating a plasma of a processing gas including $N_2$ gas; and niriding the surface of the oxide film 215 by using the plasma.

Figure 7:
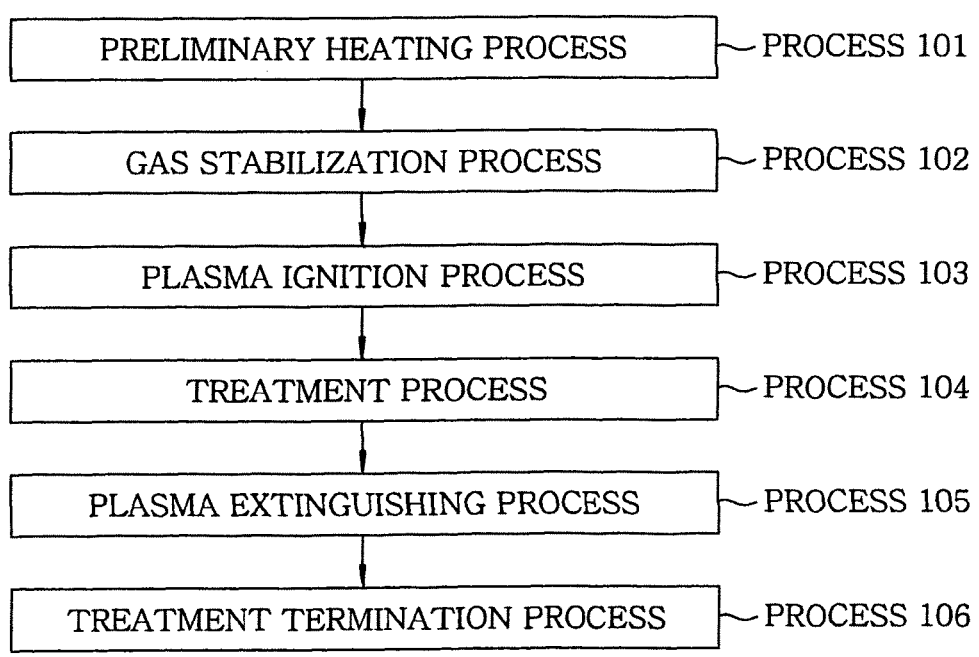
FIG. 7 depicts a flow diagram presenting a nitriding treatment performed in the plasma processing apparatus shown in FIG. 3.

Forming the nitrided region 216 on the oxide film 215 can be performed by, for example, the process presented in FIG. 7 by using the plasma processing apparatus 100. That is, first, a preheating process is performed on a substrate (step 101). In the preheating process, Ar gas is supplied into the chamber 1 at a flow rate of, e.g., 2000 sccm and the substrate is heated for a specific time period (e.g., 70 sec) while setting a temperature of the susceptor to, e.g., about 500° C. and keeping the chamber 1 under a pressure of, e.g., about 126.6 Pa. At this time, a temperature of a part of the substrate under a high pressure (the first pressure) rises more rapidly than the others.

Next, a process for stabilizing the gas and the pressure is performed (step 102). In this process, the flow rate of the Ar gas is gradually reduced to a specific flow rate (e.g., 1000 sccm) in the chamber 1 while starting to supply a nitrogen gas (e.g., the flow rate of 200 sccm) into the chamber 1 and depressurizing the internal pressure to a proper pressure level (e.g., 66.66 Pa) for a plasma ignition. A time needed for this process is, e.g., about 10 sec. It is preferable to perform this process under a higher pressure (the second pressure) than the nitriding treatment to facilitate a plasma ignition.

Then, the plasma ignition process is performed (step 103). In this process, the plasma ignition process is performed by radiating a microwave of a specific power level (e.g., 2000 W) that is higher (the first power) than the nitriding power to facilitate the ignition, from a microwave generator 39 into the chamber 1. The time needed for this process is, e.g., about 5 sec.

Thereafter, a plasma nitriding treatment process is performed for forming the nitrided region 216 by applying the plasma to the oxide film 215 (step 104). The internal pressure of the chamber 1 is adjusted to a specific pressure level (the third pressure (e.g., 20.00 Pa)) that is lower than that of the plasma ignition process and the power of the microwave is also set to a specific power level (the second power (e.g., 1500 W)) that is lower than that of the plasma ignition process. The proper time for this process is, e.g., about 90 sec.

After completing the nitriding treatment process, a plasma OFF process is started (step 105). In the plasma OFF process, the plasma is OFF by suspending the supply of the microwave while keeping the supply of the gases. Then, the time needed for this process is, e.g., about 3 sec.

After the plasma OFF, a final process is performed by stopping the gas supply and exhausting to vacuum (step 108). So, the sequence of the treatment process is finished.

Figure 8:
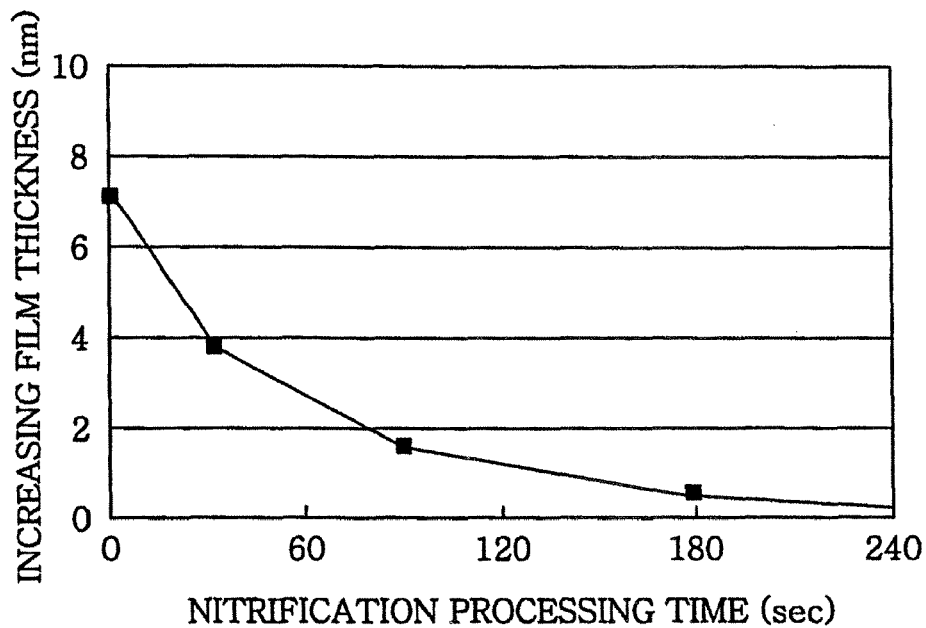
FIG. 8 provides a graph showing a result of measurements on an effect of an oxidation barrier layer in a nitriding treatment.

FIG. 8 is a graph showing a result obtained by carrying out a thermal oxidation and examining a re-oxidation state in order to measure the effects of the nitrided region as an oxidation barrier layer which is formed in the nitrided region forming process (processing temperature: 500° C.). A vertical axis and a horizontal axis of the graph represent a thickness of an increasing film and a nitriding time respectively. The thickness of the increasing film is obtained from a difference between a nitrided film thickness and the film thickness after the oxidation processing. The film thickness was measured with an optical film thickness meter (ellipsometer).

Figure 9:
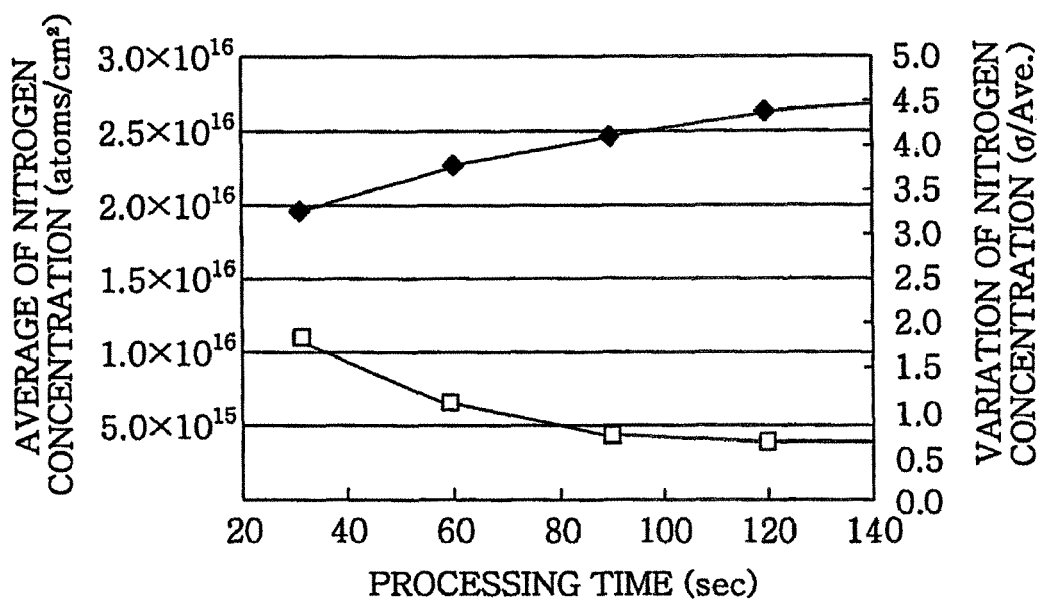
FIG. 9 presents a graph showing an average nitrogen concentration and a variation thereof in a nitriding treatment.

Further, FIG. 9 presents a graph showing a results of an average concentration of nitrogen atom and a variation thereof obtained by examining the nitrided region 216 formed in the nitrided region forming process (processing temperature: 500° C.). The vertical axis and the horizontal axis of the graph represent the average nitrogen concentration and the nitrogen concentration variation respectively. Further, the upper line and the lower line present the average nitrogen concentration and the nitrogen concentration variation respectively in FIG. 9.

The measurement presented in FIG. 8 was performed as below. First, an oxidation film of a thickness of about 7 nm was formed on the substrate by carrying out the thermal oxidation process at a temperature of 850° C., for a time period of 10 minutes, in $O_2$ gas atmosphere. Subsequently, nitrided regions were formed on the surface of the silicon substrate by a nitriding treatment for 30 sec, 90 sec and 180 sec respectively by the plasma processing and, also, the heating processing was performed on the silicon substrate at the temperature of 850° C., for the time period of 10 minutes, in the $O_2$ gas atmosphere. At this time, the increase and decrease in an oxide film were measured. As a result, the increases in film corresponding to the treatment time for 30 sec, 60 sec and 180 sec were measured to be 3.87, 1.47 and 0.46 nm respectively. From this result, a nitriding time for forming a preferred oxygen diffusion barrier layer can be preferably set to be equal to or greater than 60 sec, more preferably equal to or greater than 90 sec. Further, the result mostly corresponds to the average nitrogen concentration which increases as the processing time presented in FIG. 9. Further, as shown in FIG. 9, the variation of the nitrogen concentration decreases as processing time, as well.

As described above, it has been found that the nitrided region having sufficient effects as the oxygen diffusion barrier layer can be formed by the nitriding treatment at a low temperature of 500° C. Further, when the polysilicon layer 217 which becomes a control gate is oxidized, a $V_{th}$ shift is changed. Therefore, it is preferable to set the $V_{th}$ shift to be in a proper level for preventing it from being influenced from an effect of the oxidation. Further, the processing pressure is preferably set to be a low pressure, e.g., equal to or less than 133 Pa for forming a great quantity of ion elements, more preferably is set to be 13.3 Pa or less. The processing temperature is preferably set to be in a range from 200 to 600° C. and the flow rate ratio between the Argon gas and the Nitrogen gas (a gas flow rate of Argon/a gas flow rate of Nitrogen) is preferably set to be in a range from about 1 to 50. Further, the average concentration of Nitrogen is preferably set to be equal to or greater than $2.3 \times 10^{16}$ atoms/$cm^2$, more preferably, is set to be $2.4 \times 10^{16}$ atoms/$cm^2$ or greater.

INDUSTRIAL APPLICABILITY

A method for manufacturing semiconductor device, a semiconductor device, a method for plasma nitriding treatment and a control program and computer storage medium in accordance with the present invention have advantages when they are applied to a manufacturing area for a semiconductor device and the like. Therefore, the present invention has an industrial applicability.

What is claimed is:
1. A method for manufacturing a semiconductor device comprising:
a plasma generating process for generating a plasma of Ar gas in a first pressure and then introducing $N_2$ gas to generate a plasma of Ar gas and $N_2$ gas, the plasma of Ar gas and $N_2$ gas being generated by introducing a micro- wave into a processing chamber by means of a planar antenna provided with a plurality of slots;

a nitrided region forming process for forming a nitrided region in a second pressure on a surface of a layer including silicon on a target substrate to be processed by using the plasma of Ar gas and $N_2$ gas; and a thermal oxide film forming process for forming an oxide film on the layer including silicon on the target substrate to be processed by a heat treatment, wherein the first pressure is higher than the second pressure.

2. The method of claim 1, wherein the nitrided region is formed on a surface portion of the layer including silicon; and the oxide film is formed on sidewalls exposed by an etching process of the layer including silicon.

3. The method of claim 1, wherein the nitrided region forming process is performed for 10 sec or longer.

4. The method of claim 3, wherein the nitrided region forming process is performed for 30 sec or longer.

5. The method of claim 1, wherein the layer including silicon is made of a silicon oxide and the nitrided region forming process is performed for 60 sec or longer.

6. The method of claim 1, wherein a nitrided film and an oxide film are sequentially formed on the oxide film, and the surface of the top oxide film is nitrided by a plasma of a gas containing N2 by using a planar antenna.

7. The method of claim 1, wherein the nitrided region forming process is performed at a temperature in a range of from 100° C. to 600° C., in the second pressure in a range of from 1.33 to 399 Pa, and at a flow rate ratio of the Ar gas to the N2 gas in a range of from 1 to 300.

8. A method for a plasma nitriding treatment, wherein a plasma of Ar gas is generated in a first pressure and then $N_2$ gas is introduced to generate a plasma of Ar gas and $N_2$ gas, the plasma of Ar gas and $N_2$ gas being generated by introducing a microwave into a processing chamber by means of a planar antenna provided with a plurality of slots, and a nitrided region which functions as an oxidation barrier in a post processing is formed in a second pressure on a surface of a layer including silicon of a target substrate to be processed by the plasma of Ar gas and $N_2$ gas, wherein the first pressure is higher than the second pressure.

9. The method of claim 8, wherein the layer including silicon is made of a polysilicon and the process for forming the nitrided region is performed for 10 sec or longer.

10. The method of claim 8, wherein the layer including silicon is made of a silicon oxide and the process for forming the nitrided region is performed for 60 sec or longer.

11. The method of claim 8, wherein the process for forming the nitrided region is performed at a temperature in a range of from 100° C. to 600° C., in second pressure in a range of from 1.33 to 399 Pa, and at a flow rate ratio of the Ar gas to the N2 gas in a range of from 1 to 300.

12. The method of claim 1, wherein the nitrided region has a thickness of 0.1 nm or greater.

13. The method of claim 1, wherein a thickness of increasing film at the interface between the nitrided region and the oxide film is 0.3 nm or less.

14. The method of claim 8, wherein a thickness of increasing film at the interface between the nitrided region and the oxide film is 0.3 nm or less.

15. The method of claim 1, wherein the surface of the oxide film is nitrided by a plasma of a gas containing $N_2$ by using a planar antenna.

16. The method of claim 1, wherein the layer including silicon has a silicon oxide and a polysilicon.

17. The method of claim 8, wherein the layer including silicon has a silicon oxide and a polysilicon.

18. The method of claim 1, wherein generating the plasma of Ar gas and $N_2$ gas after introducing the $N_2$ gas is performed in the second pressure.

19. The method of claim 8, wherein generating the plasma of Ar gas and $N_2$ gas after introducing the $N_2$ gas is performed in the second pressure.

* * * * *